United States Patent [19]

Yergenson et al.

[11] Patent Number: 4,949,032

[45] Date of Patent: Aug. 14, 1990

[54] PROBE FOR DUAL IN-LINE PACKAGES

[75] Inventors: Robin P. Yergenson; Donald D. Skarke, both of Colorado Springs, Colo.

[73] Assignee: Hewlett-Packard Company, Palo Alto, Calif.

[21] Appl. No.: 252,212

[22] Filed: Sep. 30, 1988

[51] Int. Cl.$^5$ .............................................. G01R 1/06
[52] U.S. Cl. ................................ 324/158 P; 324/72.5
[58] Field of Search ............... 324/158 P, 158 F, 72.5, 324/133; 439/219, 482, 912

[56] References Cited

FOREIGN PATENT DOCUMENTS 0192057 8/1986 European Pat. Off. ............ 324/72.5
2444940 8/1980 France ................................ 324/72.5

OTHER PUBLICATIONS

Coline Ltd. Sales Brochure; M12DM4 Modular RF Detector Probe; Coline Ltd., Hatfield, Hertfordshire AL95JN, England, 3 pages.

Primary Examiner—Ernest F. Karlsen
Attorney, Agent, or Firm—Edward L. Miller

[57] ABSTRACT

A clip-on probe for a DIP includes a probe body carrying a detachable gripping portion including an extensible claw with a plurality of fingers for interdigital positioning with pins on the DIP. The extensible claw is formed at one end of a pair of flexible struts attached at a distal end to a slidable cylindrical body. The slidable cylindrical body is slidably mounted upon the outside of a hollow core having a bore running through a longitudinal axis, and is slidable back and forth along the direction of the axis, although somewhat below it. Somewhat above the bore, across from the prongs, are a pair of curved guides, in which the flexible struts travel. A compression spring urges the slidable cylindrical body along the core in a direction that retracts the extensible claw toward the prongs. The fingers of the claw and the prongs are inclined inwards to points beneath the bottom of the DIP, and thus exert a pinching action. The pair of prongs straddle one pin of the DIP. The geometry is so arranged that the bore opens out onto that pin. The detachable portion slides over the probe body; in the process a shielded contact extends through the bore. An unshielded portion of the contact extends through the bore between the prongs.

4 Claims, 8 Drawing Sheets

PROBE FOR DUAL IN-LINE PACKAGES

BACKGROUND AND SUMMARY OF THE INVENTION

There are several prior art devices that make electrical connection to the pins of a dual in-line package (DIP) of the sort commonly used to encapsulate integrated circuits. Among these is the "clothes pin" DIP clip. This type of device has a pair of plastic legs or sides pivotally hinged together and forced apart at the top by a spring under compression. This forces the bottoms of the sides together. The sides have a width (parallel to the pivotal hinge axis) generally equal to the length of the DIP upon which the clip is to be used upon. Molded in the bottom portion of the sides are narrow teeth and a recess that serve to grip the DIP both by friction and mechanical interference. Imbedded in the sides are a number of rods; one for each pin of the DIP. At the lower end the facing sides of the rods are exposed, and when placed upon the DIP the pressure of spring urges the rods against the pins of the DIP. At the upper end the rods are extended above the tops of the sides, and serve as posts onto which various conventional probe means are to be attached. Basically, the DIP clip is simply an upward mechanical extension of the pins of the DIP as they go down into the printed circuit board. And while that extension is generally mechanical secure, it is subject to some limitations and some disadvantages.

The foremost disadvantage of the DIP clip is that a given clip fits DIP's of only a very narrow range of widths. This is because the lower edges of the clip will spread apart only so far when the top edges are squeezed together. The same DIP clip that fits on a DIP 0.25 inches in width will not also fit onto a DIP of 0.9 inches in width. Another disadvantage arises from the fact that the DIP clip requires the additional connection of the actual electrical probe to the tops of the rods. There is always the worrisome possibility that the probe will, during its application or removal, cause a short between two adjacent rods. This difficulty can be mitigated by turning off the power to the device under test, but that remedy is inconvenient and time consuming at best, and may cause loss of the very conditions to be investigated. Yet another disadvantage of the DIP clip is the susceptibility to noise and cross-talk of the long unshielded rods in the DIP clip. Still another disadvantage of the DIP clip is that it comes in fixed lengths, say, fourteen pins (total, seven per side), twenty pins, etc. And while that is generally good, there are times when one needs to look at the signals of just one or two pins on an eight pin package and the only DIP clips in the drawer or junk box are too long (too many pins) to fit on the part because of interference with adjacent parts.

One needn't use a DIP clip to attach probes to a DIP; there are probes means to attach directly to the pins of the DIP itself. There are a variety of prior art hook-type probe tips, of both the single hook compression type and the opposing double hook scissors type. They all have some common annoying features. They are prone to shorting adjacent pins of the DIP. They can be hard to get hooked, and even harder to get unhooked. And frequently, they are unshielded over a significant portion of their length.

It would be desirable if there were a way to attach probe tips to the pins of a DIP without the worry of shorting adjacent pins. It would also be desirable if such a probe clip were directly usable on DIP's of widely different widths. Lastly, it would be nice if the thing were easy to get on and get off.

A clip-on probe for a DIP will have these desirable features if it is constructed in accordance with the one described herein, a brief summary of which is as follows. A probe assembly for use on a DIP includes a probe body onto which is attached a detachable gripping portion. The detachable gripping portion includes an extensible claw with a plurality of fingers for interlaced positioning with pins on the DIP. The extensible claw is formed at one end of a pair of flexible struts attached at a distal end to a slidable cylindrical body. The slidable cylindrical body is slidably mounted upon the outside of a hollow core having a bore running through a longitudinal axis, and is slidable back and forth along the direction of that axis. At one end of the cylindrical body and on either side of an aperture where the bore opens are a pair of prongs extending generally further along the direction of the axis, although somewhat below it. Somewhat above the bore, across from the prongs, are a pair of curved guides, in which the flexible struts travel. The curved guides subtend an angle of about fifty degrees of arc. As the flexible struts are extended through the curved guides the extended portions are held parallel (by the user) to the top surface of the DIP to be connected to. As a result of the curvature of the curved guides the probe body and its longitudinal axis are inclined up away from the plane of the printed circuit board by about fifty degrees, the better to provide clearance for the hand and fingers when attaching and removing the probe. A compression spring urges the slidable cylindrical body along the core in a direction that retracts the extensible claw toward the prongs. If not mounted upon a DIP the claw interferes with the curved guides to retain the cylindrical member upon the core. If mounted upon a DIP the DIP itself itself will resist the retraction, while the fingers in the claw and the prongs interlock on opposite sides with pins of the DIP. The fingers of the claw and the prongs are inclined inwards to a point beneath the bottom of the DIP, and thus exert a pinching action to retain the probe assembly on the DIP. The pair of prongs straddle one pin of the DIP. The geometry is so arranged that the bore opens out onto that pin. The detachable portion slides over the probe body; in the process a shielded contact extends through the bore. An unshielded portion of the contact extends through the bore between the prongs. It is this extended portion of the shielded contact that makes an electrical connection to the pin of interest on the DIP. The detachable portion is held onto the shield by the action of some interfering lugs on the bore and a recessed ring at a corresponding location in the shield. It is held with sufficient strength to resist the expanding push of the compression spring; the exposed contact is thus urged against the pin of the DIP by the full force attempting to retract the claw toward the prongs. A finger grip on the core and a thumb-pad on the cylindrical body allow the thumb and forefinger to extend the claw while positioning the probe upon a DIP. The tight fit that holds the detachable portion onto the probe body is also sufficient to allow the claw to be extended by a pushing motion on the thumb pad that is not countered by a pulling motion on the finger grip.

The probe automatically adjusts to the width of the DIP to which it is being attached. The length of the flexible struts and the freedom provided for the cylindrical body to travel over the core are principally what limit the width of the DIP, by determining how far the claw can be extended. Regardless of how far the claw is extended, it does so in approximately a straight line motion away from the prongs, and the compression spring supplies the force to obtain the same degree of interfering grip of the fingers and prongs upon the DIP.

Short circuits are not possible when applying the probe to a DIP. First, the diameter of the contact, extending from the bore and between the prongs, is insufficient to bridge the gap between two adjacent pins. The only way it could bridge the gap is if it were held at a considerable angle, so that its length could span the gap between the pins. But that can't happen either, because not enough of the contact extends out of the bore, and because of the interfering action of the prongs. The only way the exposed end of the contact can touch a pin is if the prongs are straddling a pin, and that precludes the conditions that would allow the contact from simultaneously being in the proximity of another pin.

Since the contact is shielded almost all the way the probe has excellent noise immunity. Finally, the probe is easily attached and removed with natural motion with the thumb and forefinger of one hand.

DESCRIPTION OF A PREFERRED EMBODIMENT

Figure 1:
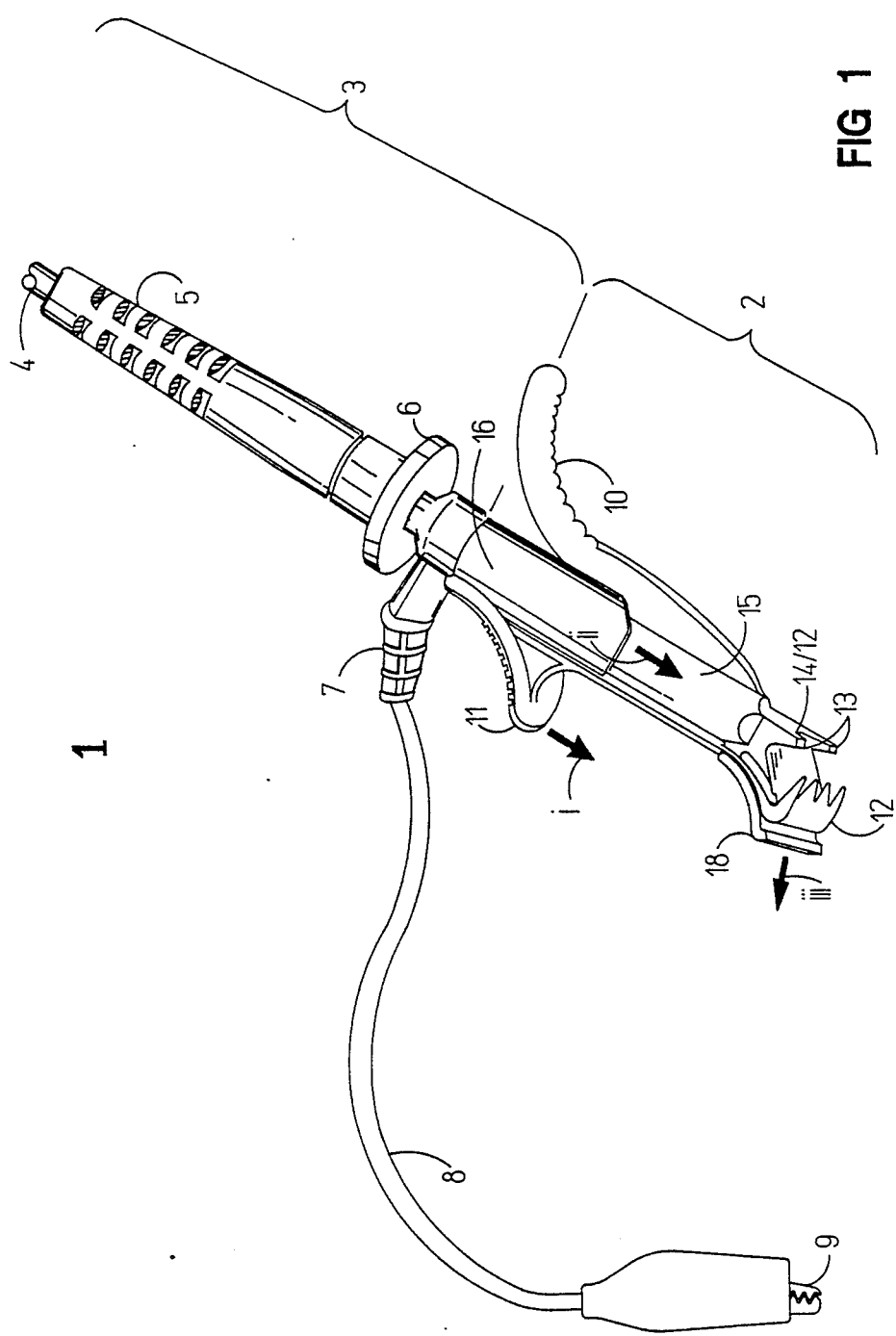
FIG. 1 is front perspective view of a clip-on probe for use on dual in-line packages (DIP's), and including a probe body and a detachable gripping portion.

Refer now to FIG. 1, wherein is shown a front perspective view of a clip-on probe 1 for making electrical contact with any pin of a dual in-line package (DIP). The clip-on probe 1 comprises a detachable gripping portion 2 that attaches to a probe body 3 (shown in greater detail in FIG. 2). A coaxial cable 4 enters the probe body 3 through a signal strain relief 5. A flange 6 anchors both the coaxial cable 4 and the signal strain relief 5 to the rest of the probe body, most of which is obscured is obscured in this view by the detachable portion 2. Also part of the probe body is a ground lead 8 having an alligator clip 9 at one end and attached to the probe body 3 at the other end by a ground strain relief 7. Ground lead 8 is electrically connected to the shield of the coaxial cable 4.

Detachable gripping portion 2 comprises principally a hollow cylindrical body 16 and a core 15. These include several features of interest, all of which will be shown and explained in greater detail in connection with FIGS. 3–7. At present, note that the detachable portion includes a finger grip 10 and a thumb-pad 11 by means of which the thumb and forefinger of one hand can exert pressure to slidably extend cylindrical body 16 along core 15 in the direction of arrows i and ii. This motion causes flexible struts 17 (only one of two is visible) to travel through guides 18 (again, only the one nearest the reader is visible—the other is on the opposite side of the core 15), causing an extensible claw 12 to move in the direction of arrow iii away from a pair of prongs 13. Each prong is narrow enough to pass between adjacent pins of the DIP, and the spacing between the prongs is such that they will straddle a pin on the DIP. Between prongs 13 is a tip 21 (see FIG. 2) of a shielded contact electrically connected to the center conductor of coaxial cable 4. Contact tip 21 is what makes electrical contact with the pin of the DIP when the clip-on probe is attached thereto. A compression spring 23 (shown in FIGS. 3–5) causes retraction of the extensible claw 12 when the pressure of the thumb and forefinger is released, thus gripping the DIP between claw 12 and prongs 13.

In a preferred embodiment both the hollow cylindrical body 16 and the core 15 are molded from "six-six" nylon. If desired, the body 16 may include a thirty percent glass fill.

Figure 2:
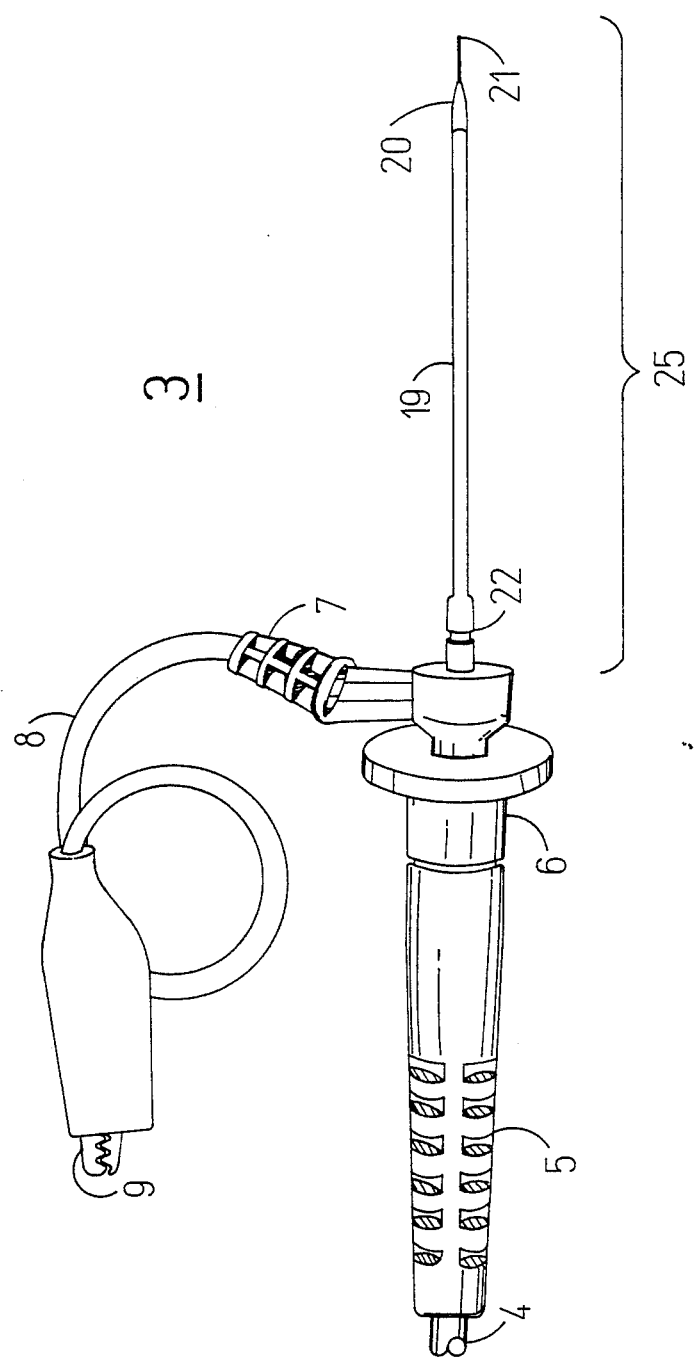
FIG. 2 is a side perspective view of the probe of FIG. 1, with a detachable gripping portion removed to expose the support for the detachable gripping portion and the actual tip of the probe.

Refer now to FIG. 2, wherein is shown a perspective side view of the probe body 3 with the detachable gripping portion 2 removed. Note contact stem 25, comprising an outer shield 19 of stainless steel miniature tubing, exposed portion of center conductor insulation 20 and exposed extended center conductor 21. When the clip-on probe 1 is assembled, as shown in FIG. 1, the contact stem 25 lies along the longitudinal axis mentioned in the Background and Summary of the Invention. Within molded flange 6 outer shield 19 is electrically connected to the outer shield of coaxial cable 4; at the same time extended center conductor 21 (which comprises a fairly stiff gold plated rod) is electrically connected to the center conductor of coaxial cable 4. The tip of extended center conductor 21 is what makes contact with the pin of the DIP to which the clip-on probe 1 is attached. Finally, note the recessed ring 22, produced by a process called "corsetting" and sometimes referred to as a "corset".

Figure 3:
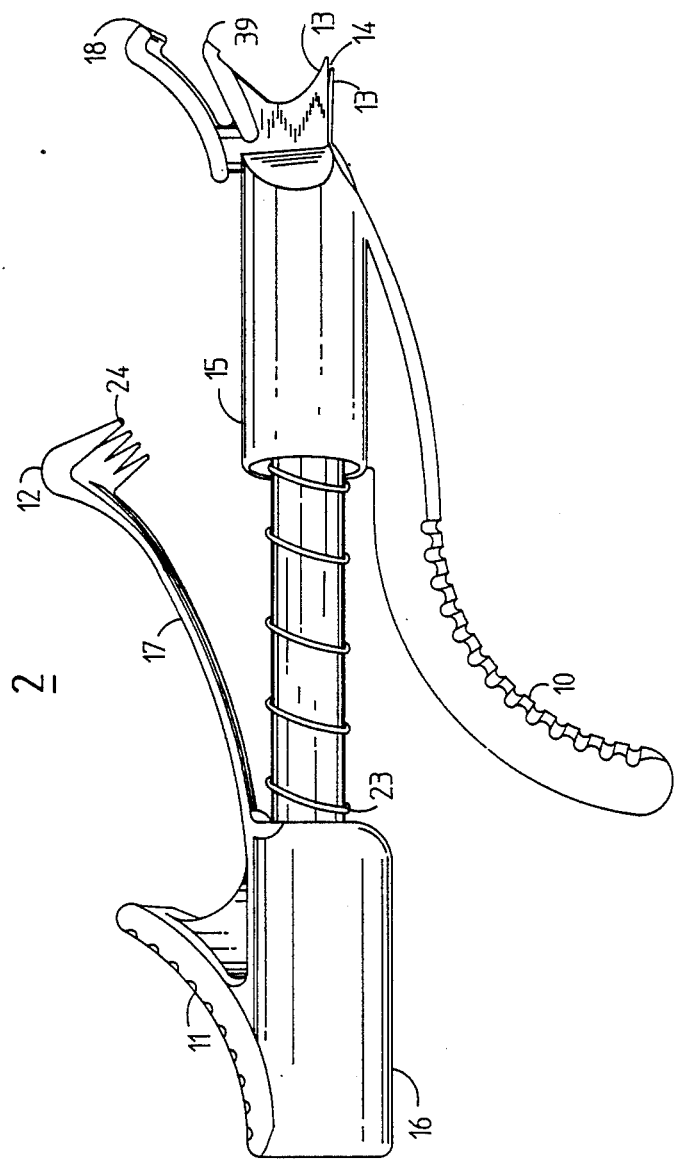
FIG. 3 is a partially exploded side perspective view of the detachable gripping portion of FIG. 1.

Refer now to FIG. 3, wherein is shown a partially exploded perspective side view of the detachable gripping portion 2. In this view the flexible struts 17 (only one is clearly visible—see FIGS. 4 and 5) have been disengaged from guide 18 (again, only one is visible—see FIG. 4) so that the claw 12 is not constrained by the guide 18. The cylindrical body 16 is shown as slid part way of of core 15, revealing compression spring 23. Note the plurality of gripping fingers 24 on extensible claw 12. In a preferred embodiment there are four fingers 24. This is an adequate number to give side-to-side stability to the clip-on probe when attached to a DIP, without causing excessive overhang beyond the end of the DIP when an end-most pin of the DIP is being probed. Also, the size and spacing of the fingers 24 (as would those of prongs 13) is determined by the outline and spacing of the pins on the DIP itself. For the most part these are standardized. In this embodiment the fingers are sufficiently narrow to pass between, and are spaced to straddle, the pins of the DIP.

The particular embodiment under discussion has a claw that includes a plurality of fingers. Those skilled in the art will appreciate that the basic functions of the claw are: (1) to anchor the flexible struts against a side of the DIP opposite the side against which the extended contact tip bears and resist the force of retraction; and (2), to assist in preventing movement of the probe after it is attached to the DIP. The movements to be resisted are in any direction, and arise from the location of the center of gravity of the probe and from the forces urging the extended contact pin against the pin of the DIP.

To this end, it will be appreciated that the claw 12 need not include a plurality of fingers, but could it self by just a single "finger" or gripping ledge. A wider (in the sense that a four-fingered claw is wider than a two-fingered one) is generally preferable to a narrow one. Furthermore, regardless of whether fingers or a gripping ledge is employed, it may be desirable to equip the claw with one or more pads of resilient frictional material to help resist slippage of the claw upon the surface of the DIP.

Figure 4:
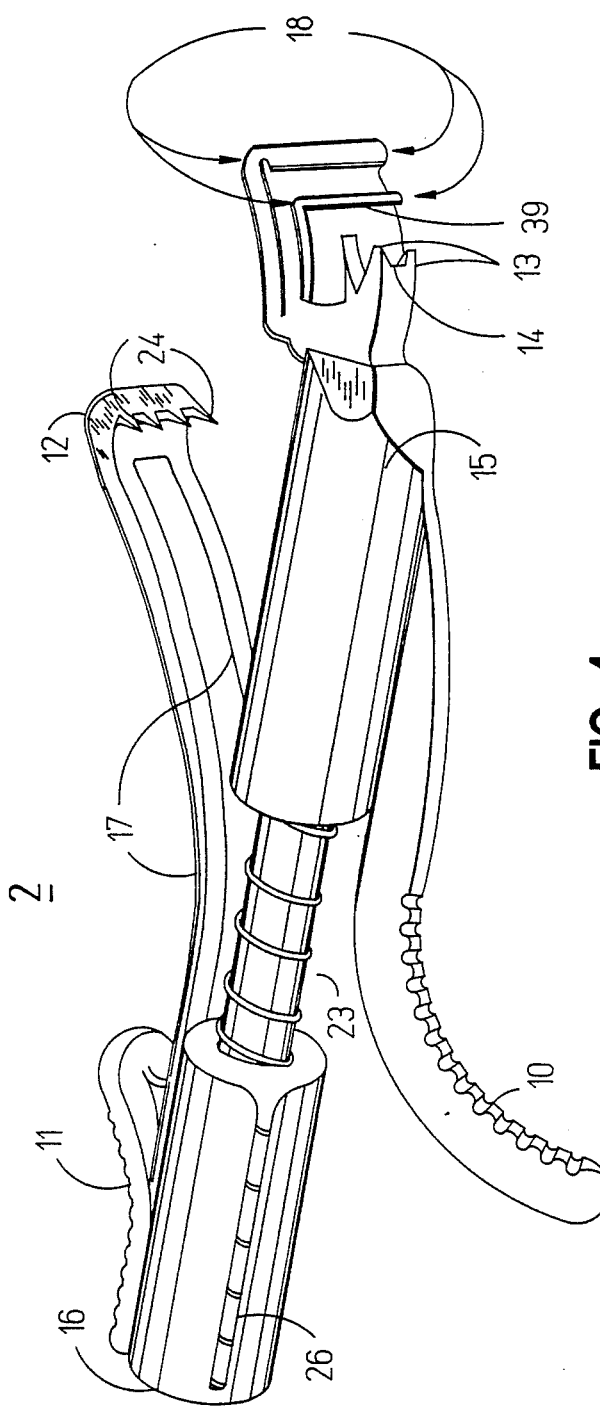
FIG. 4 is a partially exploded lower front perspective view of the gripping portion of FIG. 1.

Another view of the partially exploded detachable gripping portion of FIG. 3 is shown in FIG. 4. Note that pair of flexible struts 17. In the assembled configuration each of these travels in an associated slot or track that is part of a pair of curved guides 18. One such slot or track is visible in the Figure; the other is on the opposite side of the core 15. Note also the slot 26, which in the assembled configuration allows cylindrical body 16 to clear the finger grip 10 while sliding back and forth along the core 15. The interlocking of the slot 26 with the projecting finger grip 10 also prevents cylindrical body 16 from rotating about the core 15. Notice also how spring 23 is retained by being inside a hollow portion of the cylindrical body 16. Finally, note again the two prongs 13 formed on the nose of the core 15. In the center of a valley formed therebetween is a small hole 14. It is through this hole that the tip end 21 projects in the assembled configuration.

Figure 5:
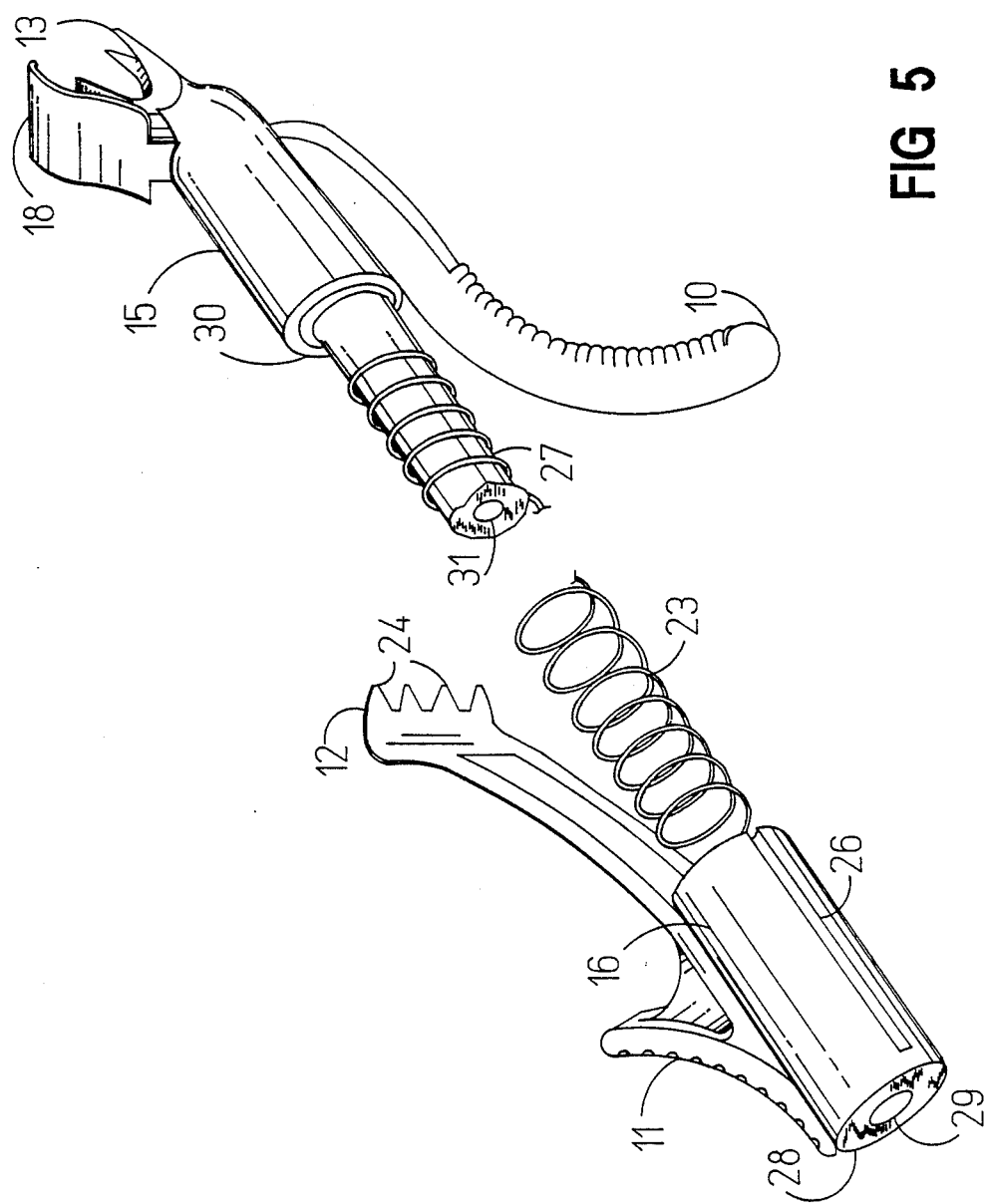
FIG. 5 is a partially exploded upper rear perspective view of the gripping portion of FIG. 1.

FIG. 5 shows yet another perspective exploded view of the detachable gripping portion. Several features of interest may be seen in this view. First, cylindrical body 16 has an end piece 28 against which (in the assembled configuration) bears one end of compression spring 23. Also, note that core 15 include a tubular barrel portion 27. This keeps compression spring 23 from kinking when compressed, and is also long enough to extend out beyond the end piece 28 through a hole therein 29. This further helps guide the cylindrical body 16 as it slides back and forth over the core 15. Note cylindrical recess 30 in core 15. It accepts the remaining end of spring 23. (A better view of this appears in FIG. 6.) Finally, note the hole 31 in the end of tubular barrel section 27. This hole is the entrance to a passage along the longitudinal axis through the core. The other end of this passage is the opening 14 of FIG. 4. It is through this passage that stem 25 passes when the detachable gripping portion 2 is attached to the probe body 3. A plurality of small bumps 32 on the inside of the passage (see FIG. 6), and located near hole 31, engage recessed ring 22 (see FIG. 2) to retain the core 15 upon the stem 25 in the assembled configuration.

Figure 6:
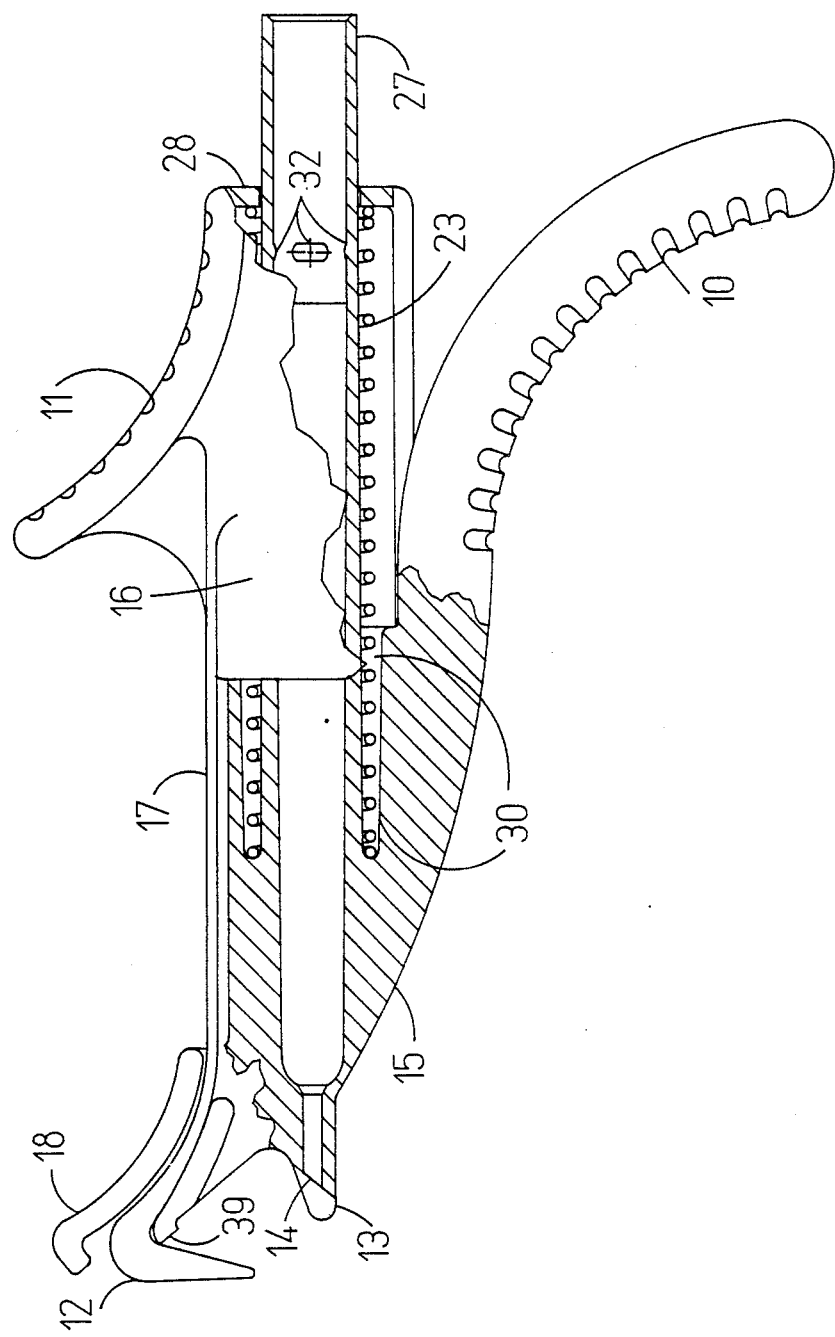
FIG. 6 is a to-scale cut-away side elevational view of the assembled detachable gripping portion of FIG. 1.

FIG. 6 is a to-scale cut-away side elevational view of the detachable gripping portion 2 in the assembled configuration.

Figure 7:
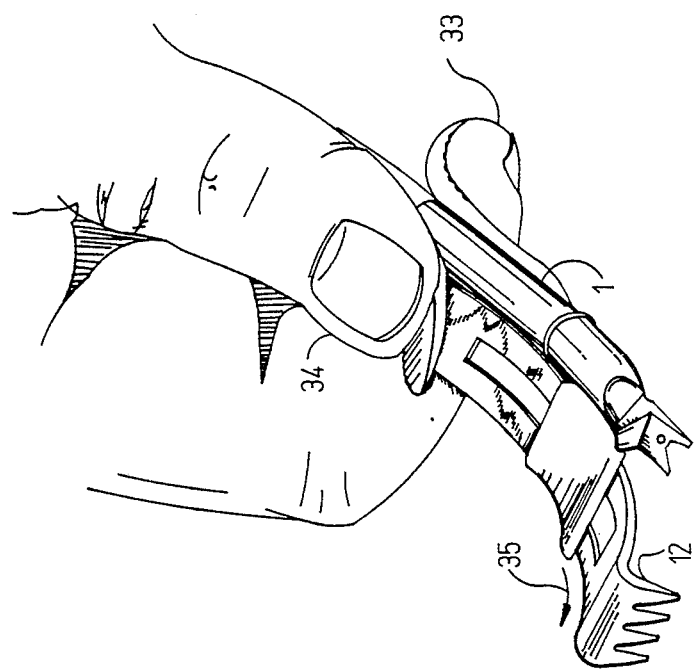
FIG. 7 is a perspective view of the complete clip-on probe held in the hand to expand the gripping portion for attachment to a DIP.

FIG. 7 illustrates how the clip-on probe 35 is held for use. As shown, the pressure exerted by pulling the forefinger 33 under the thumb 34 (or pushing the thumb beyond the forefinger, or both) has extended the claw 12 outwards in the direction of arrow 35. The clip-on probe is now ready to be attached to a DIP.

Figure 8:
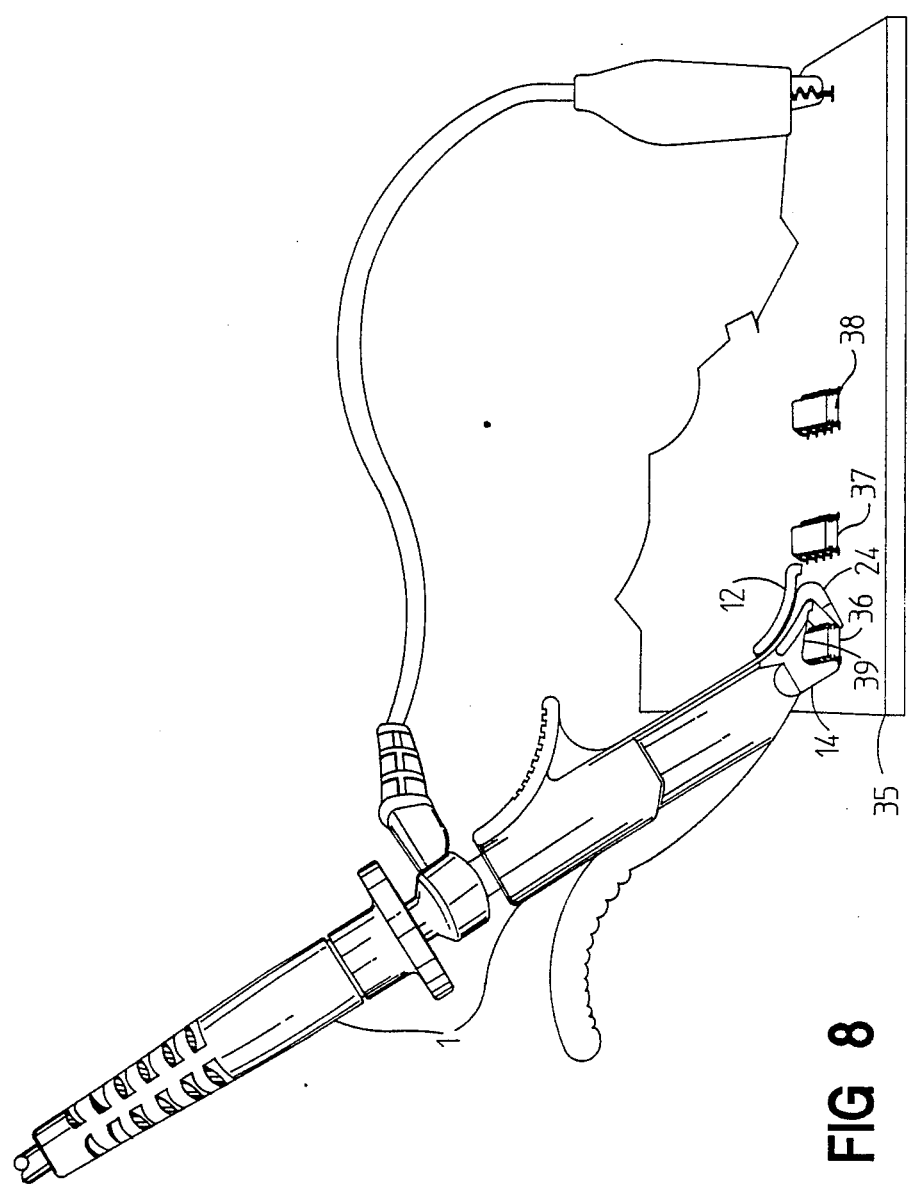
FIG. 8 is a perspective view of the complete probe attached to a DIP soldered into a printed circuit board.

FIG. 8 is a perspective illustration of the clip-on probe 1 attached to a DIP 36 that is part of a printed circuit board 35. Prongs 13 and fingers 24 of claw 12 are interlaced (inter-digitated with) the pins of the DIP, and point toward locations beneath the DIP. The force provided by compression spring 23 draws claw 12 toward prongs 13 with sufficent force to firmly hold the clip-on probe upright upon the DIP 36. Because of the angling of the fingers 24 and prongs 13 towards locations beneath the DIP the retraction of the claw 12 toward the prongs 13 develops a line of action that firmly draws the clip-on probe 1 down onto the DIP.

Contact pad 39 assists in providing stable mounting of the clip-on probe 1 onto the DIP 36, as explained below.

Contact pad 39 is on the underside of guide 18, facing the top of the DIP when in the installed configuration (see FIGS. 3, 4, 6 and 8). Contact pad 39 provides that there shall be at least two points and a line of contact between the clip-on probe and the DIP. These three locations of contact are: (1) the extended contact 21; (2) the claw; and (3) contact pad 39. In the preferred embodiment shown herein both the claw 12 and the contact pad 39 has extended or effective surface areas that provide entire lines of contact, further promoting lateral stability against side-to-side motion.

These location of mechanical contact (1) establish a limit to the movement of the clip-on probe under the forces acting upon it to (2) provide a stable and (3) predetermined attitude of the probe upon the DIP. The contact pad 39 and extended contact 21 cooperate to determine the angle of the longitudinal axis of the probe body (and thus, that of the entire probe) with respect to the top of the DIP. This is what fundamentally gives the probe its tilt with respect to the printed circuit board (the fifty degrees of the preferred embodiment). It is then this angle that must also (approximately) be matched by the angle subtended by the guide 18.

Contact tip 21 presses firmly against the pin straddled by prongs 13. Finally, note the clearance by prongs 13 and the lower end of the probe, as facilitated by the fifty degree angle of the guides. Suppose that the clip-on probe were attached to DIP 37. Then it would still clear DIP's 36 or 38, depending upon the direction which it was applied.

We claim:
1. A clip-on probe for a DIP, comprising:
resilient compression means, having first and second ends, for urging the first and second ends apart along a path therebetween;
a first body having a first axis, having a bore therethrough parallel to the first axis, and having entrance and exit orifices at opposite ends of the bore;
first and second prongs, each having a length, the first and second prongs centered about the exit orifice and projecting by their lengths from the first body and spaced apart by an amount allowing them to interdigitate with pins on the DIP;
a curved guide extending from the first body at a location proximate the exit orifice and having an entrance and an exit, the entrance of the curved guide aligned with a first plane that is parallel with the first axis and the exit of the curved guide aligned with a second plane that obtains by a non-twisted curving of the first plane;

a finger grip projecting from the first body at a location thereon one-half revolution from the curved guide about the first axis;

first retaining means, located along the first body between the entrance and exit orifices, for contacting the first end of the resilient compression means;

a second body having a second axis and a passage therethrough parallel with the second axis, having a slot therein parallel to the second axis, and having first and second orifices centered over the second axis at opposite ends of the passage;

the first body slidably engaging in the passage and the slot slidably engaging the finger grip;

second retaining means, located proximate the second orifice of the second body, for contacting the second end of the resilient compression means;

a thumbpad attached to the second body at a location thereon one-half revolution around the second body from the slot;

flexible strut means passing through the curved guide, having a distal end and attached at an opposite end to the second body at a location thereon one-half revolution around the second body from the slot, for extending the distal end as the second body slides along the first body in a first direction in response to an external force applied between the thumbpad and the finger grip, and for retracting the distal end as the second body slides along the first body in an opposite direction in response to the resilient compression means in the absence of the external force;

a plurality of gripping fingers extending from the distal end and spaced to interdigitate with pins of the DIP; and electrical contact means for passing through the bore, extending through the exit orifice by an amount less than the lengths of the first and second prongs, and for electrically contacting a pin on the DIP.

2. A clip-on probe as in claim 1 wherein the first and second bodies are generally cylindrical, the first retaining means is a diameter change in the first body and the second retaining means is a mechanical interference between the size of the second orifice and the resilient compression means.

3. A clip-on probe as in claim 1 wherein the electrical contact means is removable and further comprising means disposed upon the inside of the bore for retaining the electrical contact means therein.

4. A clip-on probe as in claim 1 wherein the curved guide subtends an angle of approximately fifty degrees.

* * * * *

UNITED STATES PATENT AND TRADEMARK OFFICE
CERTIFICATE OF CORRECTION

PATENT NO. : 4,949,032
DATED : August 14, 1990
INVENTOR(S) : Robin P. Yergenson and Donald D. Skarke It is certified that error appears in the above-identified patent and that said Letters Patent is hereby corrected as shown below:

Column 1, line 57 "means" should read --meant--; line 61 "features." should read --features:--.

Column 2, lines 53-54 "lugs on the bore and" should read --lugs on the inside of the bore and--.

Column 4, line 56 "way of of" should read --way off of--.

Column 5, line 14 "could it self" should read --could itself--.

Column 6, line 27 "has" should read --have--.

Signed and Sealed this

Fifteenth Day of December, 1992

Attest:

DOUGLAS B. COMER

*Attesting Officer*     Acting Commissioner of Patents and Trademarks